United States Patent
Sim et al.

(10) Patent No.: US 9,324,604 B2
(45) Date of Patent: Apr. 26, 2016

(54) GAP-FILL METHODS

(71) Applicants: Rohm and Haas Electronic Materials LLC, Marlborough, MA (US); Rohm and Haas Electronic Materials Korea Ltd., Chungcheongnam-do (KR)

(72) Inventors: Jae Hwan Sim, Kyonggi-do (KR); Jae-Bong Lim, Chung-Nam (KR); Jung Kyu Jo, Jung-gu Ulsan (KR); Bon-ki Ku, Cheonan-si (KR); Cheng-Bai Xu, Southborough, MA (US)

(73) Assignees: Rohm and Haas Electronic Materials LLC, Marlborough, MA (US); Rohm and Haas Electronic Materials Korea Ltd. (KR)

(*) Notice: Subject to any disclaimer, the term of this patent is extended or adjusted under 35 U.S.C. 154(b) by 0 days.

(21) Appl. No.: 14/755,471

(22) Filed: Jun. 30, 2015

(65) Prior Publication Data
US 2016/0005641 A1      Jan. 7, 2016

Related U.S. Application Data

(60) Provisional application No. 62/021,011, filed on Jul. 4, 2014.

(51) Int. Cl.
| H01L 21/31 | (2006.01) |
| H01L 21/762 | (2006.01) |
| H01L 21/3105 | (2006.01) |

(52) U.S. Cl.
CPC ..... *H01L 21/76224* (2013.01); *H01L 21/31058* (2013.01)

(58) Field of Classification Search
CPC .............. H01L 21/76224; H01L 21/31058
USPC ................. 438/781; 430/270.1, 315
See application file for complete search history.

(56) References Cited

U.S. PATENT DOCUMENTS

| 5,854,112 A | 12/1998 | Krautschneider et al. |
| 6,749,765 B2 | 6/2004 | Rutter, Jr. et al. |
| 7,361,718 B2 * | 4/2008 | Takei ............... G03F 7/094 |
| | | 257/E21.027 |

(Continued)

FOREIGN PATENT DOCUMENTS

EP      1398831 A2      3/2004

OTHER PUBLICATIONS

Takei, et al, "High-etch-rate bottom-antireflective coating and gap fill materials using dextrin derivatives in via first dual damascene lithograhy process", Proc. of SPIE, 2008, 69232P1, vol. 6923.

(Continued)

*Primary Examiner* — Karen Kusumakar
(74) *Attorney, Agent, or Firm* — Jonathan D. Baskin

(57) ABSTRACT

Provided are gap-fill methods. The methods comprise: (a) providing a semiconductor substrate having a relief image on a surface of the substrate, the relief image comprising a plurality of gaps to be filled, wherein the gaps have a width of 50 nm or less; (b) applying a gap-fill composition over the relief image, wherein the gap-fill composition comprises a first polymer comprising a crosslinkable group, a second polymer comprising a chromophore, wherein the first polymer and the second polymer are different, a crosslinker, an acid catalyst and a solvent, wherein the gap-fill composition is disposed in the gaps; (c) heating the gap-fill composition at a temperature to cause the first polymer to self-crosslink and/or to crosslink with the second polymer to form a crosslinked polymer; (d) forming a photoresist layer over the substrate comprising the crosslinked polymer-filled gaps; (e) patternwise exposing the photoresist layer to activating radiation; and (f) developing the photoresist layer to form a photoresist pattern. The methods find particular applicability in the manufacture of semiconductor devices for the filling of high aspect ratio gaps with an antireflective coating material.

10 Claims, 5 Drawing Sheets

(56) References Cited

U.S. PATENT DOCUMENTS

| | | | |
|---|---|---|---|
| 7,517,633 B2 | 4/2009 | Takei et al. | |
| 8,007,979 B2 | 8/2011 | Takei et al. | |
| 2006/0041078 A1* | 2/2006 | Takei | G03F 7/094 525/329.7 |

OTHER PUBLICATIONS

Yao, et al, "High etch-rate low-bias low out-gassing BARC via-filling materials for 193 nm ArF lithographic process", Proc. of SPIE, 2008, 69232J-1, vol. 6923.

Shinjo, et al, "ARC and gap fill material with high etch rate for advanced dual damascene process", Proc. of SPIE, 2005, 636, vol. 5753.

Huang, "Via fill properties of organic BARCs in dual damascene application", Proc. of SPIE: Advanced in Resist Technology and Processing XXI, 2004, vol. 5376.

Tsao, et al, "Accelerating the dual damascene process time by new filling material", Proc. of SPIE, 2010, 76392A, vol. 7639.

Co-Pending U.S. Appl. No. 14/582,149, filed Dec. 23, 2014.

* cited by examiner

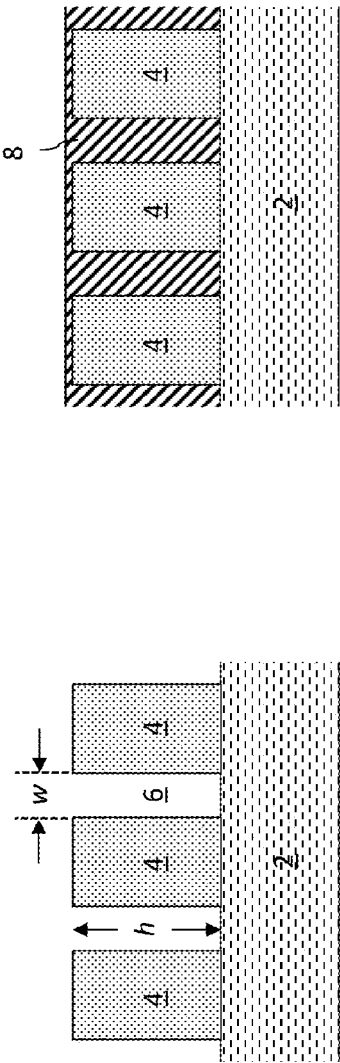
FIG. 1A
FIG. 1B
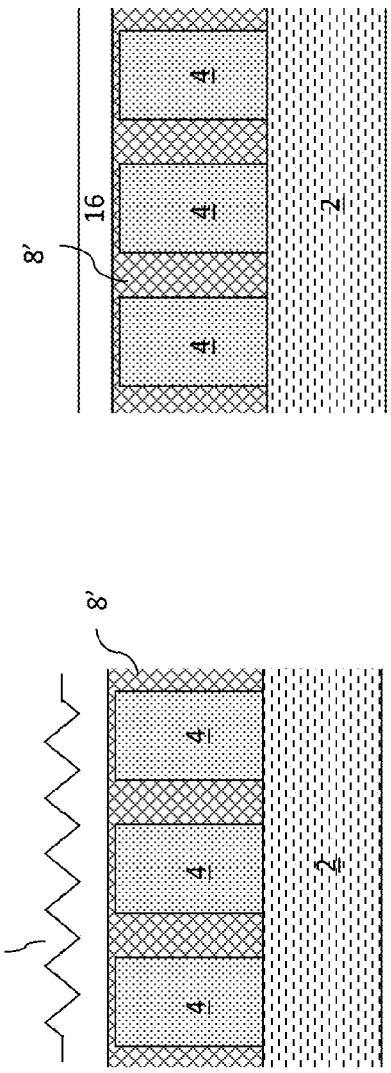
FIG. 1C
FIG. 1D

GAP-FILL METHODS

FIELD OF THE INVENTION

The invention relates generally to the manufacture of electronic devices. More specifically, this invention relates to gap-fill methods having applicability to semiconductor device manufacturing. The methods find particular use in the filling of small, high aspect ratio gaps with a material having antireflective properties.

BACKGROUND OF THE INVENTION

In the semiconductor manufacturing industry, large numbers of electronic devices are fabricated on a semiconductor substrate. With higher integration densities that occur with each new design node, devices are becoming increasingly packed together using smaller and smaller geometries with reduced spacing between features and higher aspect ratios, posing various process challenges.

One such challenge exists in the provision of antireflective materials such as a bottom antireflective coating (BARC) material over a substrate, the surface of which includes gaps, for example, trenches, holes, spacing between lines, and the like. BARC materials are typically used in photolithography as a photoresist underlayer to minimize the reflection of light from the substrate surface into the overcoated photoresist layer during exposure. Conventional BARC materials, however, are generally not suitable for use in the filling of small, high aspect ratio gaps in a substantially void-free manner and providing a planarized surface. The presence of voids can result in defects and otherwise adversely impact device reliability. For example, the formation of voids can lead to patterning defects in imaging an overcoated photoresist layer, resulting in reduced device yields. In addition, void formation can cause a worsening in etch uniformity between isolated (iso) and dense pattern areas, resulting in substrate damage by over etching in the iso pattern area. Where the filled gaps are intended to provide a device isolation function, void formation can result in current leakage between adjacent devices. To minimize defects in the formed devices, it is desirable that the gaps be filled in a substantially void-free manner. This, however, can be difficult given the reduced device geometries and constraints in BARC materials and process conditions.

To address the challenge of providing a BARC underlayer over a substrate surface containing gaps, a multi-step process employing separate steps of coating a gap-fill material and then a BARC material over the gap-fill material has been proposed. See, e.g., S. Takeia et al, *High-etch-rate bottom-antireflective coating and gap fill materials using dextrin derivatives in via first dual-damascene lithography process*, Advances in Resist Materials and Processing Technology XXV, Proc. of SPIE Vol. 6923, 69232P, (2008). This document discloses a dual damascene process involving coating a thick layer of a planarizing gap-fill material over the substrate to fill the gaps, followed by coating of a BARC material over the gap-filled substrate surface. A photoresist layer is then coated over the BARC layer and a resist pattern is formed by exposure and development processes, followed by pattern transfer by etching. This process is disadvantageous in the total number of process steps required, resulting in poor process throughput. The relatively high number of process steps also raises the potential for defects resulting from particle generation.

There is a continuing need in the semiconductor manufacturing industry for improved methods which are useful in the filling of small gaps and which provide antireflective properties, and that address one or more problems associated with the state of the art.

SUMMARY

In accordance with a first aspect of the invention, gap-fill methods are provided. The methods comprise: (a) providing a semiconductor substrate having a relief image on a surface of the substrate, the relief image comprising a plurality of gaps to be filled, wherein the gaps have a width of 50 nm or less; (b) applying a gap-fill composition over the relief image, wherein the gap-fill composition comprises a first polymer comprising a crosslinkable group, a second polymer comprising a chromophore, wherein the first polymer and the second polymer are different, a crosslinker, an acid catalyst and a solvent, wherein the gap-fill composition is disposed in the gaps; (c) heating the gap-fill composition at a temperature to cause the first polymer to self-crosslink and/or to crosslink with the second polymer to form a crosslinked polymer; (d) forming a photoresist layer over the substrate comprising the crosslinked polymer-filled gaps; (e) patternwise exposing the photoresist layer to activating radiation; and (f) developing the photoresist layer to form a photoresist pattern. The methods find particular applicability in the manufacture of semiconductor devices for the filling of high aspect ratio gaps.

The terminology used herein is for the purpose of describing particular embodiments only and is not intended to be limiting of the invention. As used herein, the singular forms "a", "an" and "the" are intended to include the plural forms as well, unless the context clearly indicates otherwise.

BRIEF DESCRIPTION OF THE DRAWINGS

The present invention will be described with reference to the following drawings, in which like reference numerals denote like features, and in which:

FIG. 1A-D illustrates a first gap-fill process flow in accordance with the invention;

DETAILED DESCRIPTION

Figure 2A:
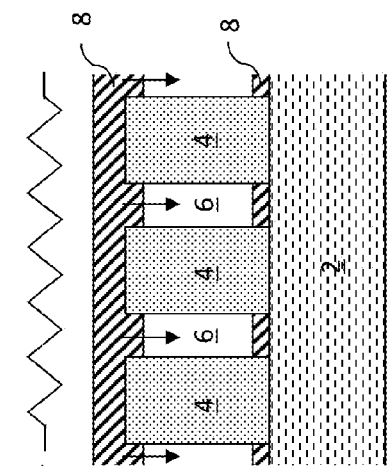
FIG. 2A-F illustrates a second gap-fill process flow in accordance with the invention.

The gap-fill methods of the invention involve application of an antireflective gap-fill composition over a relief image on a surface of a substrate. The gap-fill compositions include a first polymer that includes a crosslinkable group, a second polymer that includes a chromophore and which is different from the first polymer, a crosslinker, an acid catalyst and a solvent, and may include one or more additional optional components.

The first polymer (also referred to herein as "crosslinkable polymer") includes a crosslinkable group allowing for crosslinking between the first polymer and the second polymer (also referred to herein as "antireflective polymer") having antireflective properties, and allowing for crosslinking within the first polymer. The crosslinkable group can be chosen, for example, from one or more of hydroxyl, carboxyl, thiol, amine, epoxy, alkoxy, amide and vinyl groups. Of these, hydroxyl is preferred.

The first polymer preferably contains a unit of general formula (I) and/or formula (II) containing the crosslinkable group, as follows:

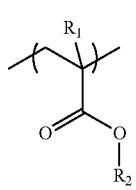

(I)

wherein: $R_1$ is chosen from hydrogen, fluorine, $C_1$-$C_3$ alkyl and $C_1$-$C_3$ fluoroalkyl; and $R_2$ is chosen from: optionally substituted $C_1$ to $C_{12}$ linear, branched or cyclic alkyl; and optionally substituted $C_6$ to $C_{15}$ aryl (e.g. phenyl, napthyl, anthracenyl), optionally containing heteroatoms, the optional substituents including, for example, halogen, nitro, cyano and $C_1$ to $C_5$ alkyl; wherein at least one hydrogen atom on $R_1$ and/or on $R_2$ is substituted with a crosslinkable functional group, for example, a crosslinkable group independently chosen from hydroxyl, carboxyl, thiol, amine, epoxy, alkoxy, amide and vinyl groups. Of these, hydroxyl is preferred. Positions on $R_2$ for the functional groups are not limited and can be, for example, on a primary, secondary or tertiary position. In the case, for example, of a hydroxyl group, a primary, secondary or tertiary alcohol can be used.

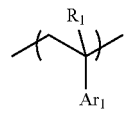

(II)

wherein $R_3$ is chosen from hydrogen, fluorine, $C_1$-$C_3$ alkyl and $C_1$-$C_3$ fluoroalkyl, with hydrogen being typical; and $Ar_1$ is an optionally substituted aryl group, the optional substituents including, for example, halogen, nitro, cyano and $C_1$ to $C_5$ alkyl, wherein at least one hydrogen atom on $R_3$ and/or on $Ar_1$ is substituted with a crosslinkable functional group, for example, a crosslinkable group independently chosen from hydroxyl, carboxyl, thiol, amine, epoxy, alkoxy, amide and vinyl groups. Of these crosslinkable groups, hydroxyl is preferred. Preferably, $Ar_1$ include 1, 2 or 3 aromatic carbocyclic and/or heteroaromatic rings. It is preferred that the aryl group comprises a single aromatic ring, and more preferably a phenyl ring. Where multiple aromatic rings are present, the rings can be fused, for example, naphthyl or anthracenyl. The aryl group is optionally substituted, for example, with halogen, nitro, cyano, optionally substituted $C_1$-$C_{15}$ linear, branched or cyclic alkyl, for example, fluorinated or nonfluorinated butyl, isobutyl, hexyl, decyl, cyclohexyl, adamantyl or norbonyl, alkenyl, alkynyl, $C_6$-$C_{18}$ aryl, for example, benzyl, phenyl, naphthyl or anthracyl, and combinations thereof.

Suitable units providing crosslinking functionality for the first polymer include, for example, the following:

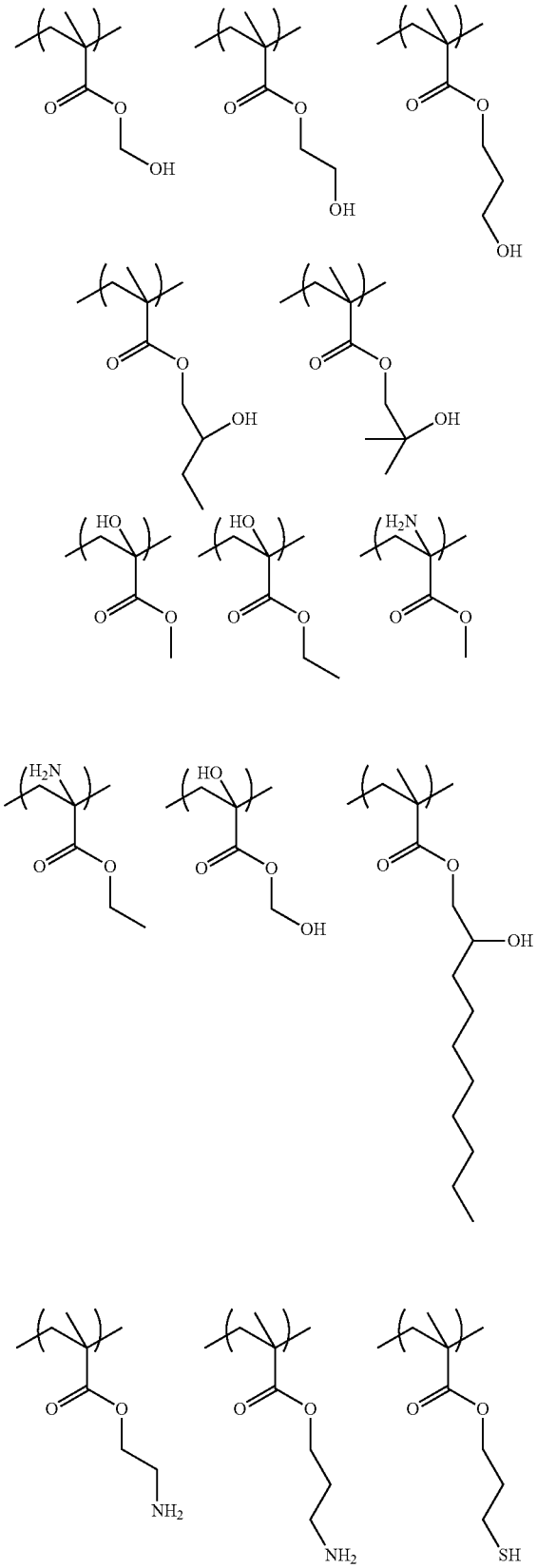

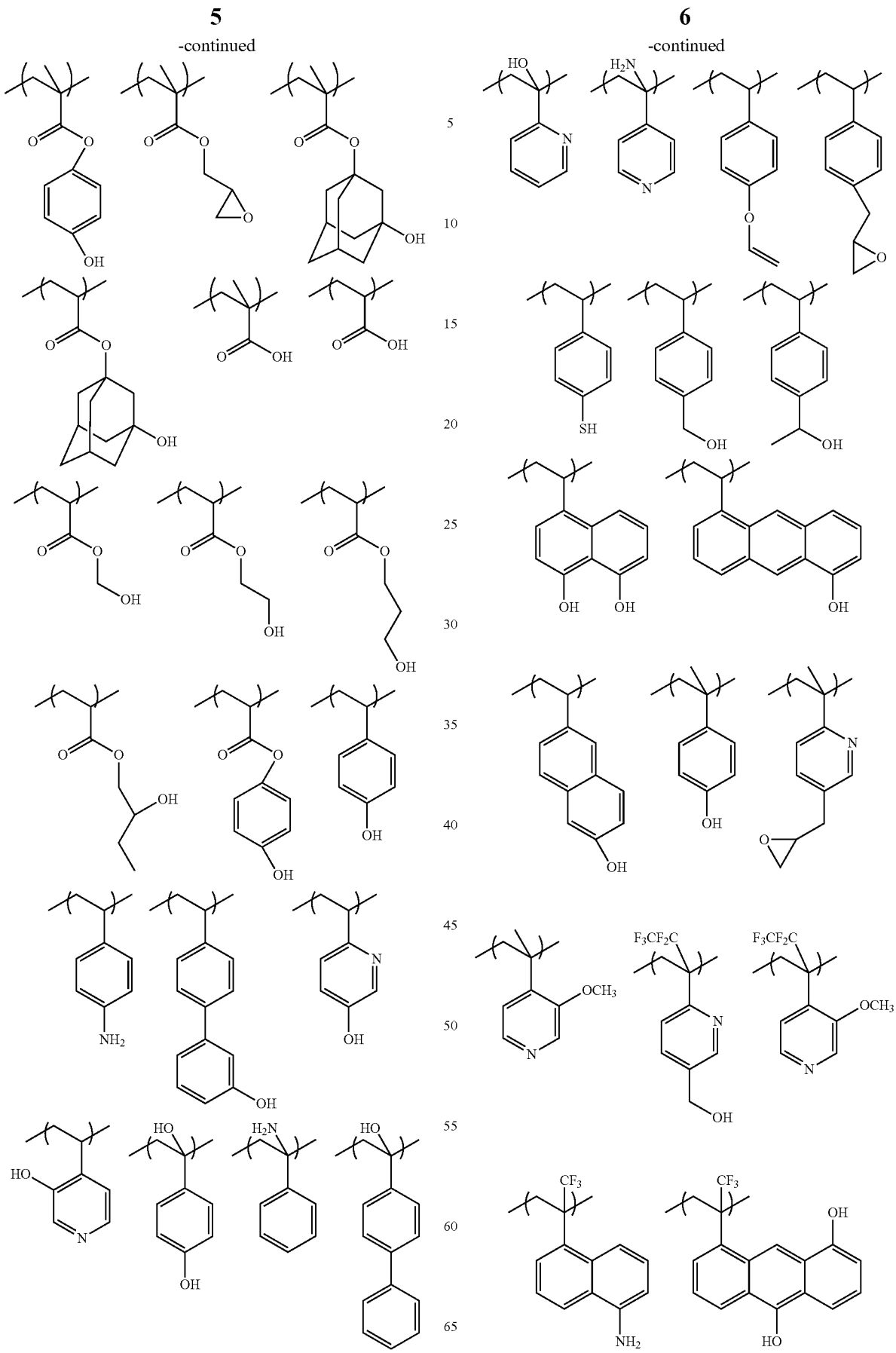

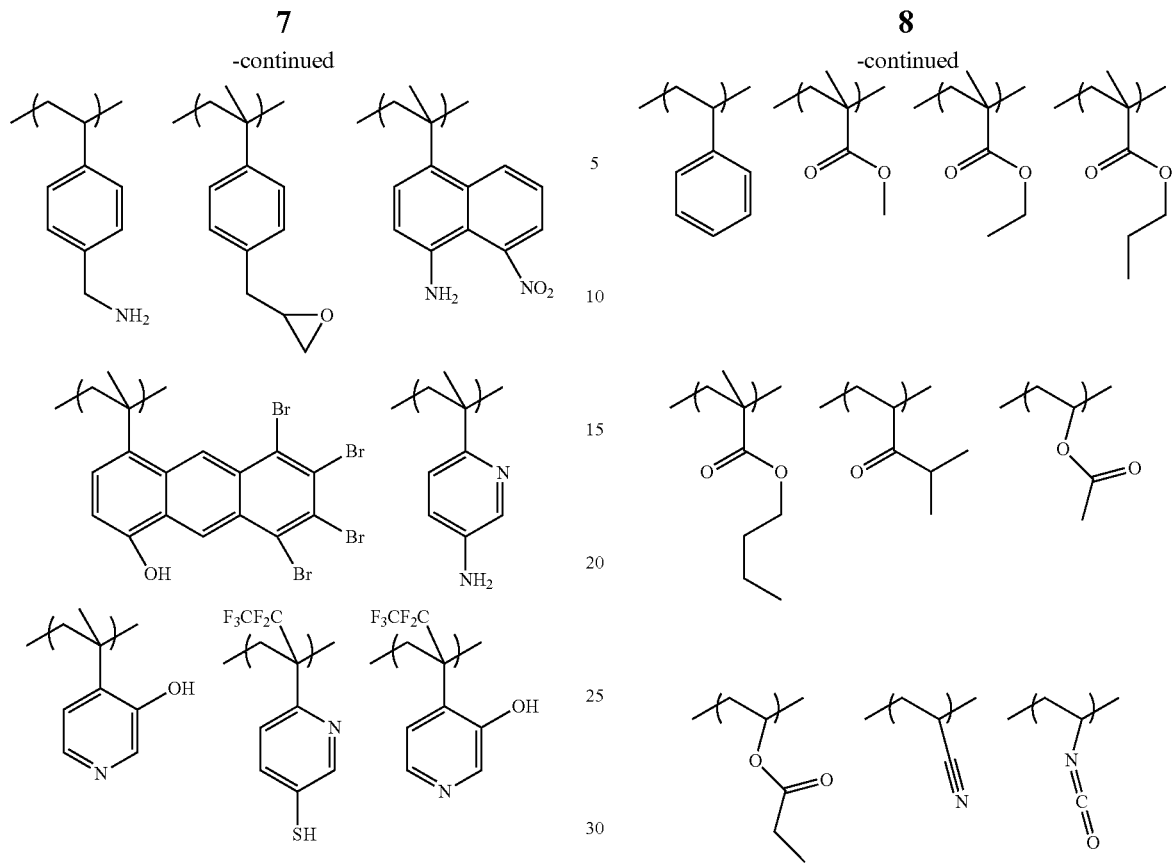

The crosslinkable unit(s) are typically present in the first polymer in an amount of from 5 to 100 mol %, based on the first polymer.

In one aspect, the repeat units of the first polymer include only units containing crosslinkable groups, for example, units of general formula (I) and/or (II), i.e., the first polymer consists of units containing crosslinkable groups. In this case, the first polymer can be made up of a single type of unit of general formula (I) or (II). Alternatively, the first polymer can include different types of units containing crosslinkable groups, for example, of general formula (I) and/or of general formula (II).

The first polymer can include one or more additional unit not having crosslinking functionality. The polymer can, for example, include one or more additional units for purposes of adjusting properties of the gap-fill composition, for example, etch rate and solubility. Suitable additional units include, for example, one or more units chosen from (meth)acrylates for solubility, vinyl ethers, vinyl ketones and vinyl esters for faster etch, and styrenic units for thermal stability Suitable additional units include, for example, the following:

Of these additional units, styrene units are preferred. The one or more additional units if present in the first polymer are typically present in an amount of up to 95 mol %.

The first polymer typically has a weight average molecular weight Mw of less than 30,000, from 3000 to 30,000, preferably from 4000 to 10,000, from 3000 to 6000, from 4000 to 6000, with from 4500 to 6000, being typical. Preferable molecular weights will allow for reasonable yields during synthesis and low swelling/high stripping resistance to solvents with which the gap-fill compositions come into contact in use, for example, solvents used in photoresist and developer materials. High swelling/low stripping resistance can result in pattern collapse during patterning of the overcoated photoresist.

The polydispersity index (PDI) of the first polymer is not particularly limited. Typically, the first polymer has a polydispersity index (PDI) of 1.05 or more, typically from 1.05 to 2.0. The first polymer is typically present in the gap-fill composition in an amount of from 50 to 95 wt %, for example, from 50 to 85 wt % or from 50 to 65 wt %, based on total solids of the composition.

Suitable polymers as the first polymer having a crosslinkable group include, for example, the following:

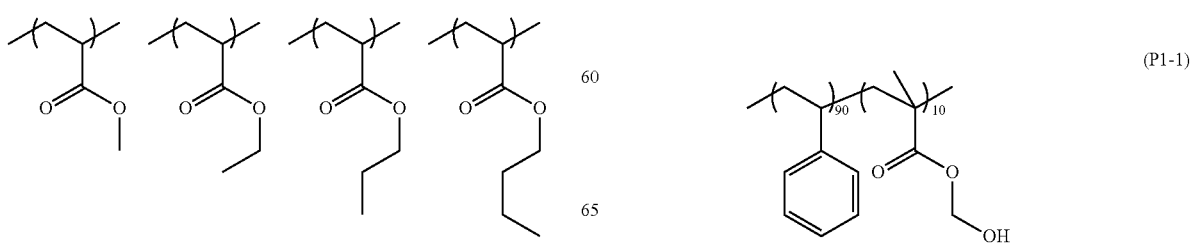

(P1-2)
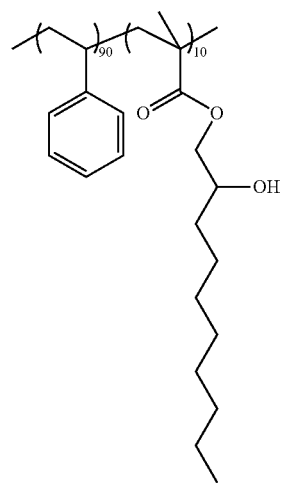
(P1-3)
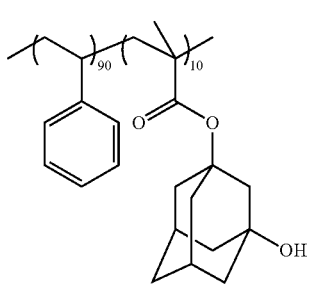
(P1-4)
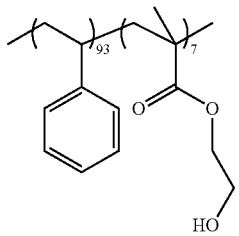
(P1-5)
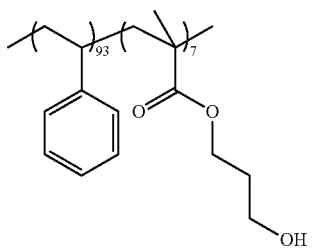
(P1-6)
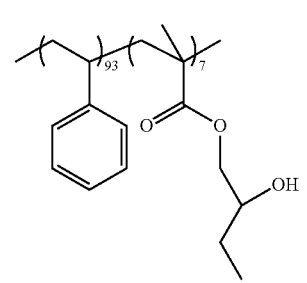
(P1-7)
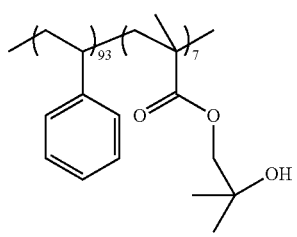
(P1-8)
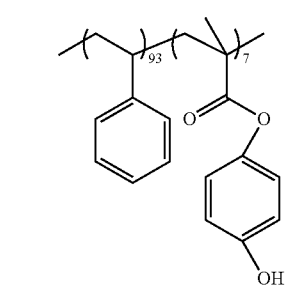
(P1-9)
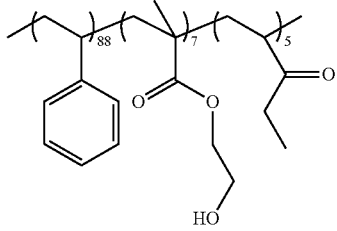
(P1-10)
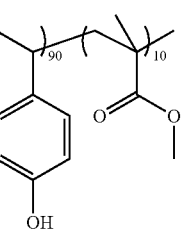
(P1-11)
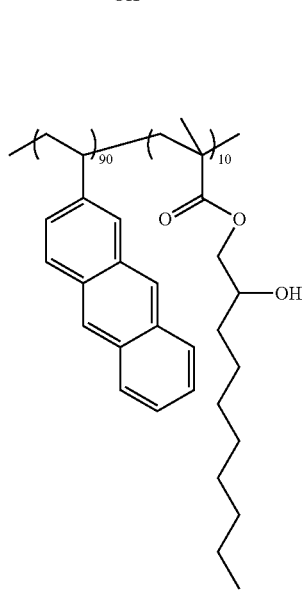

-continued
(P1-12) 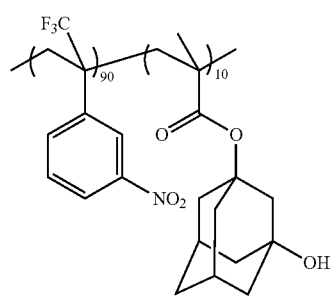
(P1-13) 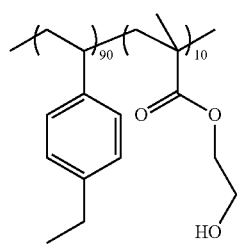
(P1-14) 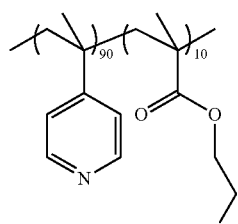
(P1-15) 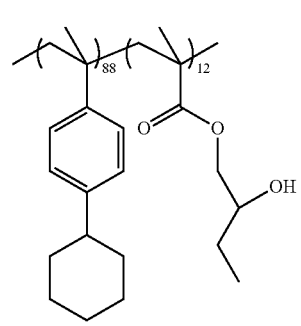
(P1-16) 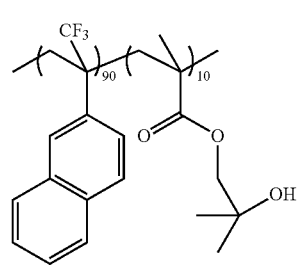
(P1-17) 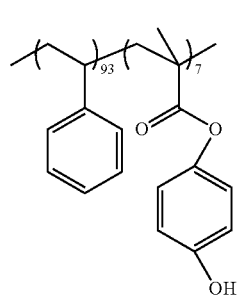
-continued
(P1-18) 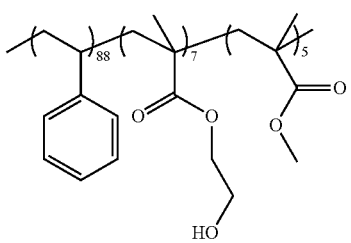
P(1-19) 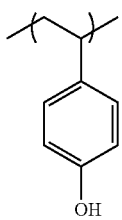
(P1-20) 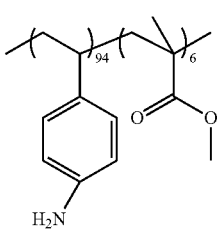
(P1-21) 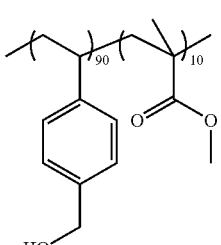
(P1-22) 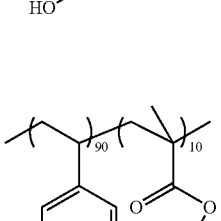
(P1-23) 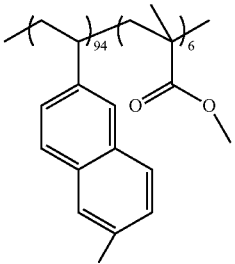
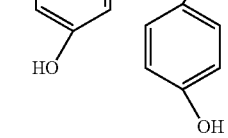

-continued (P1-24)
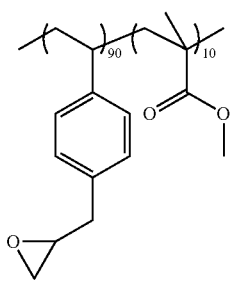

(P1-25)
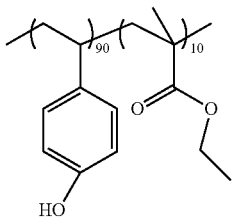

The second polymer is present in the gap-fill compositions to impart or enhance antireflective properties of the composition during exposure of an overcoated photoresist layer. These antireflective properties, for example, n- and k-values, can be fine-tuned by adjustment of the ratio of the second polymer to the first polymer. Typically, the second polymer has a faster etch rate than the first polymer with respect to an etchant used in the patterning process such that the second polymer can impart a faster etching rate to the composition in a coated, cured state.

The second polymer includes one or more units containing a chromophore, absorptive of radiation at the exposure wavelength for an overlying photoresist layer. As used herein, "chromophore" refers to a group that absorbs and/or attenuates the desired wavelength of the radiation used to image the photoresist. For example, when the gap-fill compositions of the present invention are to be used with photoresists for imaging at an exposure wavelength, for example, of 248 or 193 nm, monomers containing as the chromophore aromatic or substituted aromatic moieties may be used. Such aromatic monomers may be used to form the second polymer. Suitable aromatic monomers include, but are not limited to, those containing phenyl, substituted phenyl, naphthyl, substituted naphthyl, anthracenyl, substituted anthracenyl, phenanthrenyl, substituted phenanthrenyl, and the like. "Substituted aromatic" refers to aromatic groups having one or more of their hydrogens replaced with one or more other substituent groups, such as $(C_1-C_{12})$alkyl, halo, cyano, $(C_1-C_6)$alkoxy, and the like. Suitable anthrancenyl monomers are disclosed in U.S. Pat. No. 5,851,730 (Thackeray et al). Particularly useful chromophore containing monomers are those of formula (III):

(III)
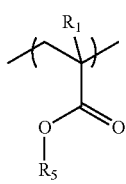

wherein $R_4$ is chosen from hydrogen, fluorine, $C_1-C_3$ alkyl and $C_1-C_3$ fluoroalkyl, typically hydrogen or methyl; and $R_5$ is chosen from optionally substituted phenyl, benzyl,

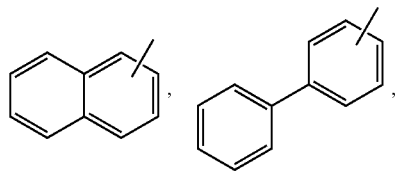

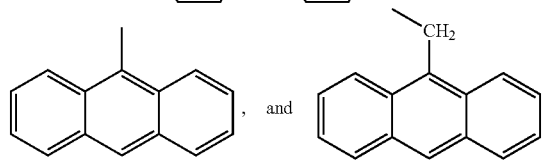
, and

The optional substituents can include, for example, halogen, nitro, cyano, optionally substituted $C_1-C_{15}$ linear, branched or cyclic alkyl, for example, fluorinated or nonfluorinated butyl, isobutyl, hexyl, decyl, cyclohexyl, adamantly and norbonyl, alkenyl and alkynyl. It will be appreciated by those skilled in the art that the absorption or attenuation of the antireflective compositions of the present invention may be increased by increasing the amount of such chromophores in the second polymer.

The chromophore-containing unit(s) are typically present in the second polymer in an amount of from 10 to 50 mol %, preferably from 15 to 30 mol %, based on the second polymer.

In one aspect, the repeat units of the second polymer include only chromophore-containing units, whether a homopolymer or a copolymer containing 2, 3, 4 or more different types of units. The second polymer can include one or more additional unit not having a chromophore. The second polymer can, for example, include one or more additional units for purposes of adjusting properties of the gap-fill composition, for example, etch rate, degree of crosslinking, and solubility. Suitable additional units include, for example, one or more units chosen from (meth)acrylate for solubility, vinyl ether, vinyl ketone and vinyl ester for faster etch, and such units having a crosslinkable group. Suitable additional units for the second polymer can include, for example, one or more additional units such as the structures described above with respect to the first polymer.

The one or more additional units if present in the second polymer are typically present in an amount of up to 90 mol %, preferably from 70 to 85 mol % based on the polymer.

The second polymer typically has a weight average molecular weight Mw of less than 20,000, for example, from 3000 to 20,000, preferably from 5000 to 20,000, from 5000 to 15000, or from 5000 to 10,000. As discussed with respect to the first polymer, preferable molecular weights will allow for reasonable yields during synthesis and low swelling/high stripping resistance to solvents with which the gap-fill compositions come into contact in use, for example, solvents used in photoresist and developer materials. High swelling/low stripping resistance can result in pattern collapse during patterning of the overcoated photoresist.

The polydispersity index (PDI) of the second polymer is not particularly limited. Typically, the second polymer has a polydispersity index (PDI) of 1.05 or more, typically from 1.05 to 3.0. The second polymer is typically present in the gap-fill composition in an amount of from 5 to 50 wt %, for example, from 5 to 40 wt % or from 5 to 30 wt %, based on total solids of the composition. The weight ratio of the first polymer to the second polymer is typically from 1:1 to 5:1, preferably, from 2:1 to 4:1.

Suitable antireflective polymers for use as the second polymer include, for example, the following:

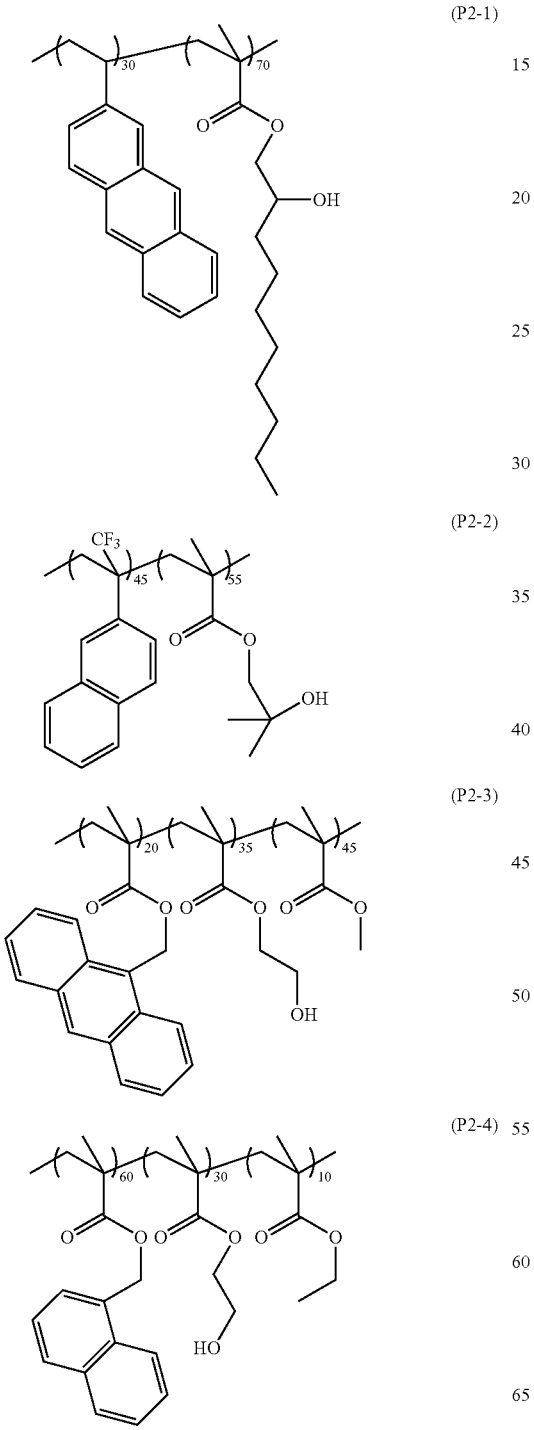

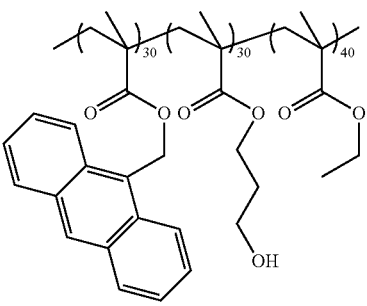

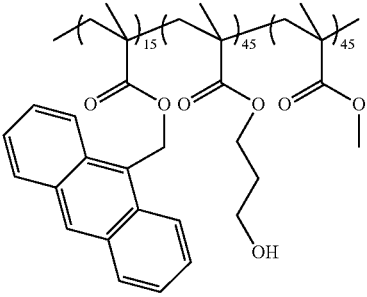

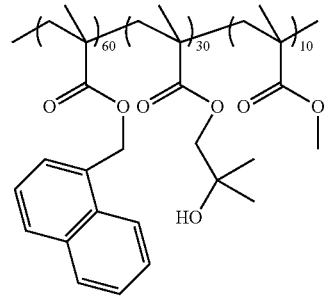

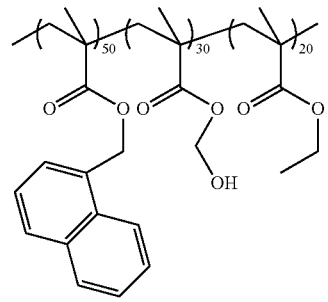

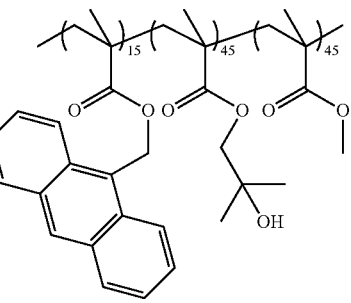

The first and second polymers are not crosslinked in the composition prior to curing. As such, they can more effectively fill small dimensioned high aspect ratio gaps such as holes, trenches and spaces between lines and other features.

This is believed to be a result of lower molecular weight and volume as compared with crosslinked materials Crosslinkers useful in the present invention are any which undergo acid catalyzed crosslinking with the crosslinkable polymers. Suitable crosslinkers include, for example, di-, tri-, tetra-, or higher multi-functional ethylenically unsaturated monomers. Crosslinkers useful in the present invention include, for example: trivinylbenzene, divinyltoluene; divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DE-GDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol diacrylate, tetraethylene glycol dimethacrylate, polyethylene glycol dimethacrylate, ethoxylated bisphenol A diacrylate, ethoxylated bisphenol A dimethacrylate, polyethylene glycol dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane), tetra($C_1$-$C_8$)alkoxyglycoluril such as tetramethoxyglycoluril and tetrabutoxyglycoluril, and combinations thereof. Preferably, the crosslinker is a tetra-alkoxyalkyl glycouril, a hexamethylol melamine or an aromatic compound having multi-functional groups suitable for acid catalyzed crosslinking. Suitable crosslinkers are commercially available. The crosslinker is typically present in an amount of from 4 to 25 wt %, for example, from 10 to 22 wt % based on the total solids of the composition.

Acid catalysts useful in the present invention include free acids and acid generators. Any free acid which is compatible with the compositions of the present invention and catalyzes crosslinking of the polymer and crosslinker is suitable for use in the present invention. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid.

Suitable acid generators include thermal acid generators (TAGs), photoacid generators (PAGs) and combinations thereof. A thermal acid generator is a compound which is capable of generating an acidic moiety when heated. The thermal acid generator can be nonionic or ionic. Suitable nonionic thermal acid generators include, for example, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g. phenyl, napthyl, anthracenyl, etc.) and heteroaryl (e.g. thienyl) sulfonate salts, aliphatic sulfonate salts and benzenesulfonate salts. Compounds that generate a sulfonic acid upon activation are generally suitable. Preferred thermal acid generators include p-toluenesulfonic acid ammonium salts.

A photoacid generator is a compound which is capable of generating an acidic moiety when exposed to activating radiation. Suitable photoacid generators include, for example, sulfide and onium type compounds. Photoacid generators include, but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, (4-tbutylphenyl) tetramethylenesulfonium (3-hydroxyadamantanyl ester)-tetrafluoro-butanesulfonate), (4-tbutylphenyl) tetramethylenesulfonium (adamantanyl ester)-tetrafluoro-butanesulfonate) and dibutylnaphthylsulfonium triflate. Preferred PAGs include tetramethylenesulfonium compounds.

Certain photoacid generators can also function as thermal acid generators, generating an acid upon exposure to activating radiation or heat. The following compounds, for example, can function as a PAG or TAG:

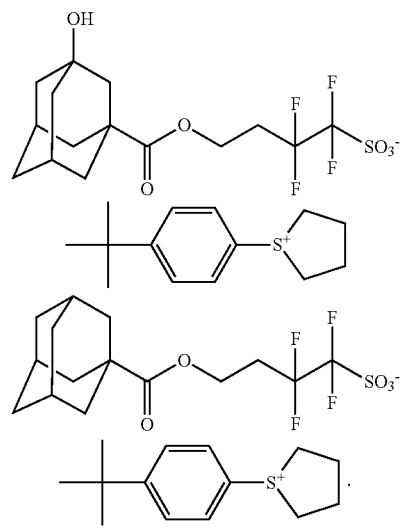

When used as a TAG, these compounds provide relatively slow crosslinking (high crosslinking onset temperature) as compared with ammonium salts.

A combination of acid catalysts can be used in the present invention. Suitable combinations include, for example, a free acid with a photoacid generator, a free acid with a thermal acid generator or a thermal acid generator with a photoacid generator.

Suitable acid catalysts are commercially available. The acid catalyst is typically present in the composition in an amount of from 0.1 to 8 wt %, preferably from about 0.5 to about 5 wt %, based on the total solids of the composition.

The gap-fill composition further includes a solvent which can include a single solvent or a solvent mixture. Suitable solvent materials to formulate and cast the gap-fill composition exhibit very good solubility characteristics with respect to the non-solvent components of the gap-fill composition, but do not appreciably dissolve the underlying relief image or other materials of the substrate surface coming into contact with the gap-fill composition. The solvent is typically chosen from water, aqueous solutions, organic solvents and mixtures thereof. The solvent is preferably an organic solvent. Suitable organic solvents for the gap-fill composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3, 4,4,5,5,6,6-decafluoro-1-hexanol, and $C_5$-$C_9$ fluorinated diols such as 2,2,3,3,4,4-hexafluoro-1,5-pentanediol, 2,2,3,3, 4,4,5,5-octafluoro-1,6-hexanediol and 2,2,3,3,4,4,5,5,6,6,7, 7-dodecafluoro-1,8-octanediol; esters-based solvents such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate, diethyl carbonate, methyl acetate, ethyl acetate, gamma-buterolactone, gamma-valerolactone, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, 2-hydroxyisobutyric acid methyl ester and the like; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; ethers such as isopentyl ether and dipropylene glycol monomethyl ether; and mixtures containing one or more of these solvents. Of these solvents, propylene glycol monomethyl ether acetate, gamma-butyrolactone, 2-hydroxyisobutyric acid methyl ester and their combinations are preferred. The solvent component of the gap-fill composition is typically present in an amount of from 80 to 99 wt %, more typically, from 90 to 99 wt % or from 95 to 99 wt %, based on the total weight of the gap-fill composition.

The gap-fill composition may include one or more optional additives including, for example, surfactants and antioxidants. Such optional additives if used are each typically present in the composition in minor amounts such as from 0.01 to 10 wt % based on total solids of the gap-fill composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable nonionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.).

An antioxidant can be added to prevent or minimize oxidation of organic materials in the gap-fill composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl.anilino)2,4-bis.octyl-thio-1,3,5-triazine, n-octadecyl-3-(4'-hydroxy-3',5'-di-tert-butyl.phenyl)propionate, octylated phenol, aralkyl-substituted phenols, alkylated p-cresol and hindered phenol; bis-, tris- and poly-phenols such as 4,4'-dihydroxy.diphenyl, methylene.bis (dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The gap-fill compositions of the invention, when applied to a substrate containing gaps, can effectively fill the gaps in a substantially void free manner. The gap-fill compositions typically have a viscosity of from 1.0 poise to 50 poise at the gap-filling process temperature.

The gap-fill compositions can be prepared following known procedures. For example, the compositions can be prepared by dissolving the solid components of the composition in the solvent components. The desired total solids content of the compositions will depend on factors such as the desired final layer thickness. Typically, the solids content of the gap-fill compositions is from 1 to 20 wt %, for example, from 1 to 10 wt %, more typically, from 1 to 5 wt %, based on the total weight of the composition.

Gap-Fill Methods

Methods of the invention in accordance with a first aspect will now be described with reference to FIG. 1A-D. FIG. 1A depicts in cross-section a semiconductor substrate 2. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon, and may have one or more layers and patterned features formed on a surface thereof. Layers forming part of the substrate may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers such as single-crystal silicon, carbon layers and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

The uppermost layer of the substrate includes a relief image 4 that defines gaps 6 to be filled. The gaps to be filled may be present in the base substrate material itself or in a layer formed over the base substrate material and can take various forms. The gaps can, for example, take the form of trenches, holes, spacing between lines, pores in a porous material and, advantageously can be extremely narrow in width and having high aspect ratios. The relief image typically is formed by a lithographic process, for example, a photolithographic or assembly process such as directed assembly (DSA). An etching process such as an anisotropic dry etch is typically used for pattern transfer to an underlying layer from which the relief image and gaps can be formed. In the illustrated embodiment, the gaps extend completely through the material layer from which the relief image is formed, exposing the underlying substrate. It may be desirable that the gaps extend only partially through the material layer. In the case of a photolithography process, it is preferable to use an exposure radiation of less than 300 nm in wavelength such as 248 nm 193 nm or an EUV wavelength (e.g., 13.4 or 13.5 nm), or electron beam exposure.

The illustrated gaps have a height h and a width w, and can be of relatively narrow width and large height. Processes and compositions in accordance with the invention are suitable for use in the filling of gaps having relatively high aspect ratios. As used herein, aspect ratio (AR) is defined as AR=h/w, wherein h is the gap height and w is the gap width. Typically, the gap width is from 1 nm to 200 nm, for example, 1 nm to 100 nm, 1 nm to 50 nm, 1 nm to 25 nm or from 1 to 10 nm, and is preferably 50 nm or less, for example, 20 nm or less, 15 nm or less, 10 nm or less, or 5 nm or less. The aspect ratio is typically 1 or more, for example, 2 or more, or 5 or more, for example, from 1 to 20, from 2 to 20, or from 5 to 20.

As shown in FIG. 1B, a gap-fill composition 8 as describe herein is applied to the wafer surface over the relief image 4. The gap-fill composition can be applied to the substrate by spin-coating, dipping, roller-coating or other conventional coating technique. Of these, spin-coating is typical and preferred. For spin-coating, the solids content of the gap-fill composition can be adjusted to provide a desired film thickness based upon the specific coating equipment utilized, the viscosity of the solution, the speed of the coating tool and the amount of time allowed for spinning. The desired coated thickness of the gap-fill composition will depend, for example, on the geometry of the gaps to be filled. While the thickness will depend on the application and gap geometry, typical thickness for the antireflective gap-fill composition 8 is from about 200 to 3000 Å.

The gap-fill composition is typically next softbaked at a temperature and time to evaporate residual solvent from the layer. The softbake temperature is lower than the onset temperature to avoid premature crosslinking of the polymer. The softbake can be conducted with a hotplate or oven, with a hotplate being typical. The softbake can, for example, be conducted on a hotplate of a wafer track also used for coating of the gap-fill composition. The softbake temperature and time will depend, for example, on the particular composition and thickness of the gap-fill composition. The softbake is typically conducted at a temperature of from about 70 to 150° C., and a time of from about 30 to 90 seconds.

With reference to FIG. 1C, the composition is next heated at a temperature and time to cause the crosslinkable polymer to crosslink, thereby forming a crosslinked polymer 8'. The crosslinking bake can be conducted on a hotplate or in an oven 14, with a hotplate being typical. The crosslinking bake can, for example, be conducted on a hotplate of a wafer track also used for coating of the gap-fill composition. The crosslinking bake temperature and time will depend, for example, on the particular composition and thickness of the softbaked gap-fill composition. The crosslinking bake is typically conducted at a temperature of from about 150 to 300° C., and a time of from about 30 seconds to 3 minutes. The crosslinking bake can be conducted, for example, by heating the gap-fill composition at a single temperature or by ramping the temperature. Optionally, the heating can include a terraced temperature profile. The softbake and crosslinking bake can be conducted in a single process using the same heater, for example, by ramping the temperature from softbaking to crosslinking temperature.

Following crosslinking of the gap-fill composition, further processing of the substrate is conducted to form a final device, which can include a memory (e.g., DRAM) or logic device. The further processing can include, for example, one or more of formation of a layer 16 over the substrate as shown in FIG. 1D, polishing, chemical-mechanical planarization (CMP), ion implantation, annealing, CVD, PVD, epitaxial growth, electroplating and lithographic techniques such as DSA and photolithography. Advantageously, coating of a liquid layer containing a solvent, for example, by spin-coating, directly over the crosslinked gap-fill composition, can be conducted without intermixing with the underlying crosslinked material.

Typically, the further processing includes a photolithography process, wherein a photoresist layer is coated over the crosslinked gap-fill composition. The antireflective properties of the gap-fill material can reduce or prevent the extent of reflection from the substrate into an overlying photoresist layer.

Figure 2B:
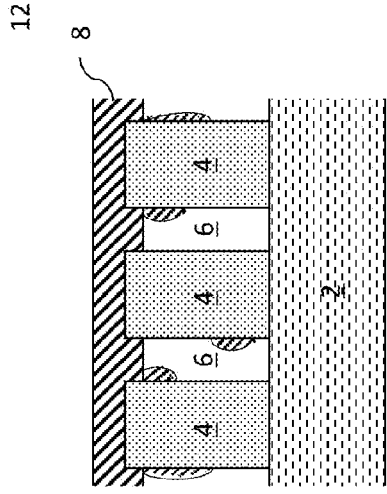
Figure 2C:
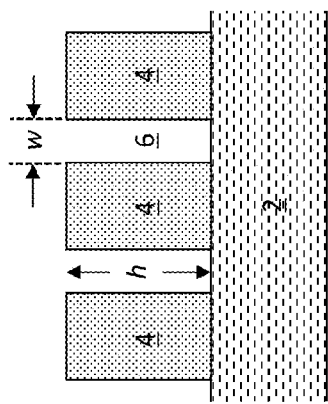
Figure 2D:
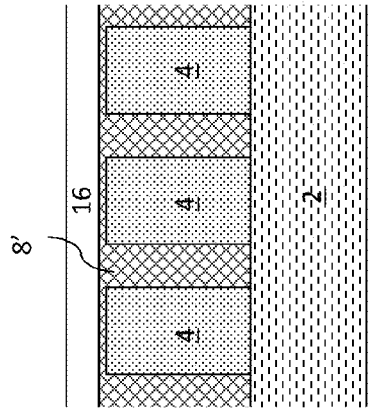

FIG. 2A-F illustrates a method in accordance with a further aspect of the invention, wherein application of the gap-fill composition 8 to the wafer 2 does not completely fill the gaps, as shown in FIG. 2B. This can occur, for example, for very fine gaps, high viscosity gap-fill compositions and/or higher molecular weight crosslinkable polymers. Depending on the softbake temperature, gap-fill composition and gap dimensions and geometry, partial or complete gap-filling may occur during softbake if the polymer viscosity is sufficiently reduced. Except as otherwise indicated, the description above with respect to the process shown in FIG. 1 applies also to the process described with reference to FIG. 2.

Where gap-filling of a patterned substrate is incomplete following coating and softbake (see FIGS. 2A and 2B), the softbaked gap-fill composition can be heated in a gap-fill bake at a temperature that is greater than the softbake temperature and for a time effective to cause the gap-fill composition to fill the plurality of gaps. As shown in FIG. 2C, the gap-fill bake can be conducted with a hotplate or oven 12, with a hotplate being typical. The gap-fill bake can, for example, be conducted on a hotplate of a wafer track also used for coating of the gap-fill composition and softbake. The gap-fill bake temperature and time will depend, for example, on the particular composition and thickness of the softbaked gap-fill composition. The gap-fill bake is typically conducted at a temperature of from about 150 to 200° C., and a time of from about 30 seconds to 10 minutes. Preferably, the gap-fill bake temperature is 10 C.° or more lower than the onset temperature, preferably 20 C.° or more or 30 C.° or more lower than the onset temperature of the composition. Preferably, the gap-fill bake temperature is 15 C.° or more lower than the crosslinking bake temperature, preferably 25 C.° or more or 35 C.° or more lower than the crosslinking bake temperature. During the gap-fill bake process, the viscosity of the softbaked gap-fill composition 8 becomes lower, allowing the material to fill gaps 6, as shown in FIGS. 2C and 2D.

Figure 2E:
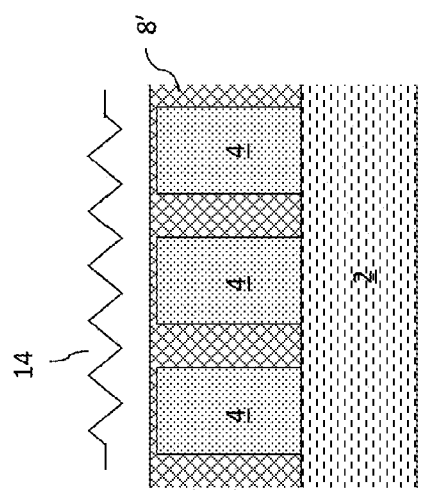
Figure 2F:
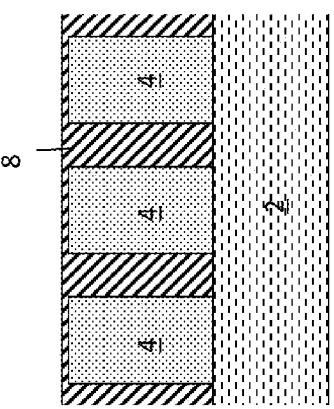

With reference to FIG. 2E, the composition is next heated at a temperature that is greater than the temperature of the gap-fill bake to cause the non-crosslinked crosslinkable polymer to crosslink. The crosslinking bake can be conducted on a hotplate or in an oven 14, with a hotplate being typical. The crosslinking bake can, for example, be conducted on a hotplate of a wafer track also used for coating of the gap-fill composition. The crosslinking bake temperature and time will depend, for example, on the particular composition and thickness of the softbaked gap-fill composition. The crosslinking bake is typically conducted at a temperature of from about 200 to 300° C., and a time of from about 30 seconds to 30 minutes. Optionally, the gap-fill bake and crosslinking bake can be conducted in a single process. The gap-fill and crosslinking bake can, for example, be conducted sequentially using the same heating tool. The heating can be conducted, for example, by continuously ramping the temperature or using a terraced temperature profile to perform both gap-fill and crosslinking baking functions. Following the gap-fill process, further processing is conducted to form the final device.

The following non-limiting examples are illustrative of the invention.

EXAMPLES

Polymer Synthesis

Example 1

Synthesis of Polystyrene-co-HEMA) (93/7)

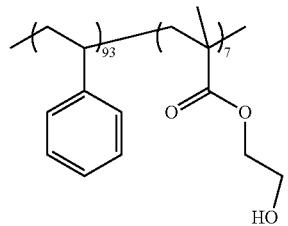

A polymer feed solution was prepared by combining 48.14 g styrene monomer (liquid) and 1.86 g 2-hydroxyethyl methacrylate monomer (liquid) in a 100 ml glass bottle. The bottle was shaken slightly to mix the monomers, and was placed in an ice bath to allow the temperature of monomer mixture to reach equilibrium with the ice bath. 1.373 g of V601 azo initiator (white powder, Wako Pure Chemical Industries, Ltd.) was added into the bottle and the bottle was shaken to completely dissolve the initiator. The bottle was returned to the ice bath. 50 g of 1-butanol was charged into a three-neck 250 ml round bottom flask equipped with a thermal controller, and the flask was purged with nitrogen. A three-neck 250 ml round bottom flask containing reaction mixture was heated until the temperature of the reaction mixture reached 80° C. The monomer feed solution was fed into the reactor at a rate of 0.92 ml/min for a total feeding time of ~60 minutes. The reactor was maintained at 80° C. for one additional hour after completion of monomer feeding. Heating was stopped and the reactor was allowed to cool down to room temperature with stirring. The resulting polymer solution was precipitated with methyl alcohol (10× excess of reaction mixture), filtered and vacuum dried, to provide Poly(styrene-co-HEMA) (93/7) [Mw=19 k, PDI=1.6; PS:HEMA=93:7 mol %, by $^{13}$C-NMR].

Example 2

Synthesis of Poly(ANTMA-co-HEMA-co-MMA)

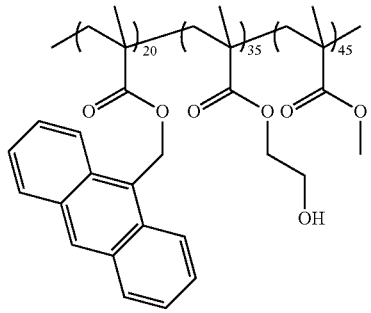

A polymer feed solution was prepared by combining 20.5 g methylanthracene methacrylate monomer, 15.5 g 2-hydroxyethyl methacrylate monomer, 14.0 g methyl methacrylate, and 50 g propylene glycol monomethyl ether acetate (PGMEA) in a 250 ml three neck, round-bottom flask fitted with a mechanical stirrer, thermal controller, thermal probe, heating mantle and nitrogen purge inlet (sweep). The reaction mixture was heated until the temperature of the reaction mixture reached 80° C. 16.15 g of PGMEA solution containing 10 wt % of Vazo 67 azo initiator (white powder, Dupont) was next added to the flask. The flask was heated until the temperature of the reaction mixture reached 90° C. and maintained for 6 hours with stirring. Heating was stopped and the reactor was allowed to cool down to 40° C. Un-reacted monomers were eliminated in vacuum condition and the resulting polymer solution was diluted to 17 wt % (+/−5 wt %) with PGMEA. The resulting polymer solution displayed [Mn=2776; Mw=8160; PDI=2.9; ANTMA:HEMA; MMA=20:35:45 mol %, by $^{13}$C-NMR].

Example 3

Synthesis of Poly(hydroxymethylbenzene-co-MMA)

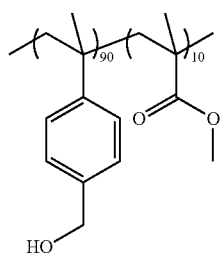

A polymer feed solution was prepared by combining 62.09 g 4-(vinylphenyl)methanol monomer and 1.43 g methyl methacrylate monomer in a 250 ml glass bottle. The bottle was shaken slightly to mix the monomers, and was placed in an ice bath to allow the temperature of the monomer mixture to reach equilibrium with the ice bath. 1.0 g V601 azo initiator (white powder, Wako Pure Chemical Industries, Ltd.) was added into the bottle and the bottle was shaken to completely dissolve the initiator. The bottle was returned to the ice bath. 50 g 1-butanol was charged into a three-neck 250 ml round bottom flask equipped with a thermal controller, and the flask was purged with nitrogen. A three-neck 250 ml round bottom flask containing the reaction mixture was heated until the temperature of the reaction mixture reached 80° C. The monomer feed solution was fed into the reactor at a rate of 0.92 ml/min for a total feeding time of ~60 minutes. The reactor was maintained at 80° C. for one additional hour after completion of monomer feeding. Heating was stopped and the reactor was allowed to cool down to room temperature with stirring. The resulting polymer solution was precipitated with methyl alcohol (10× excess of reaction mixture), filtered and vacuum dried, to provide Poly(hydroxymethylbenzene-co-MMA) (90/10) [Mw=15 k; PDI=1.5; Hydorxybenzne:MMA=90:10 mol %, by $^{13}$C-NMR].

Example 4

Synthesis of Poly(ANTMA-co-MHPMA-co-MMA)

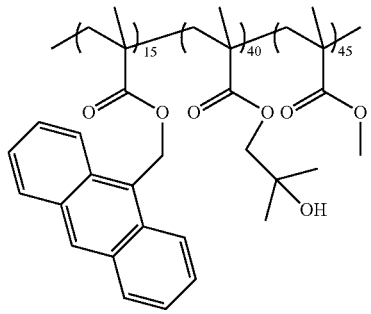

A polymer feed solution was prepared by combining 15.38 g methylanthracene methacrylate monomer, 18.8 g 2-methyl, 2-hydroxypropyl methacrylate monomer, 14.0 g methyl methacrylate and 50 g propylene glycol monomethyl ether acetate (PGMEA) in a 250 ml three neck, round-bottom flask fitted with a mechanical stirrer, thermal controller, thermal probe, heating mantle and nitrogen purge inlet (sweep). The reaction mixture was heated until the temperature of the reaction mixture reached 80° C. 16.15 g PGMEA solution containing 10 wt % Vazo 67 azo initiator (white powder, Dupont) was next added to the flask. The flask was heated until the temperature of the reaction mixture reached 90° C. and maintained for 6 hours with stirring. Heating was stopped and the reactor was allowed to cool down to 40° C. The resulting polymer solution was precipitated with methyl alcohol (10× excess of reaction mixture), filtered and vacuum dried, to provide Poly(ANTMA-co-MHPMA-co-MMA) polymer powder [Mw=10K; PDI=2.5; ANTMA:MHPMA; MMA=15:40:45 mol %, by $^{13}$C-NMR].

Example 5

Synthesis of Poly(ANTMA-co-HPMA-co-EMA)

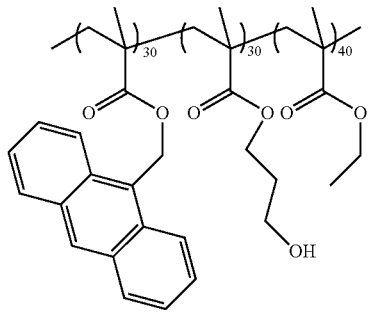

A polymer feed solution was prepared by combining 30.76 g methylanthracene methacrylate monomer, 16.6 g 3-hydroxypropyl methacrylate monomer, 16.0 g ethyl methacrylate, and 50 g propylene glycol monomethyl ether acetate (PGMEA) in a 250 ml three neck, round-bottom flask fitted with a mechanical stirrer, thermal controller, thermal probe, heating mantle and nitrogen purge inlet (sweep). The reaction mixture was heated until the temperature of the reaction mixture reached 80° C. 16.15 g PGMEA solution containing 10 wt % Vazo 67 azo initiator (white powder, Dupont) was next added to the flask. The flask was heated until the temperature of the reaction mixture reached 90° C. and maintained for 8 hours with stirring. Heating was stopped and the reactor was allowed to cool down to 40° C. The resulting polymer solution was precipitated with methyl alcohol (10× excess of reaction mixture), filtered and vacuum dried, to provide Poly (ANTMA-co-HPMA-co-EMA) polymer [Mw=8K; PDI=2.5; ANTMA:HPMA; EMA=30:30:40 mol %, by $^{13}$C-NMR].

Gap-Fill Compositions

Example 6

Gap-Fill Composition 1

0.3463 g tetramethoxymethyl glycouril, 0.0277 g p-TSA ammonium salt (T-1), 0.0017 g fluorochemical surfactant Polyfox 656 (OMNOVA Solutions Inc.), 2.0685 g PS-HEMA polymer of Example 1, 0.6173 g PGMEA, and 106.3687 g methyl-2-hydroxy isobutyrate (HBM) were added to 6 g of a PGMEA solution containing 16.98 wt % of the Poly (ANTMA-co-HEMA-co-MMA) polymer of Example 2 to obtain a 3 wt % solution, based on total weight of the composition. The solution was filtered through a PTFE micro filter with 0.45 micron pore size to obtain Gap-fill Composition 1 [n/k at 248 nm=1.68/0.1].

Example 7

Gap-Fill Composition 2

0.3463 g tetramethoxymethyl glycouril, 0.0277 g p-TSA ammonium salt (T-1), 0.0017 g fluorochemical surfactant Polyfox 656 (OMNOVA Solutions Inc.), 2.0685 g Poly(4-hydroxystyrene) (Nisso, Japan, Mw=5.3K, PDI=1.1), 0.2566 g PGMEA, and 99.5191 g methyl-2-hydroxy isobutyrate (HBM) was added to 6 g of a PGMEA solution containing 16.98 wt % of the Poly(ANTMA-co-HEMA-co-MMA) polymer of Example 2 to obtain a 3 wt % solution, based on total weight of the composition. The solution was filtered through a PTFE micro filter with 0.45 micron pore size to obtain Gap-fill Composition 2 [n/k at 248 nm=1.7/0.1].

Example 8

Gap-Fill Composition 3

0.54 g tetramethoxymethyl glycouril, 0.0435 g p-TSA ammonium salt (T-1), 0.0027 g fluorochemical surfactant Polyfox 656 (OMNOVA solutions Inc.), 3.2 g Poly(4-hydroxystyrene) (Nisso, Japan, Mw=5.3K, PDI=1.1), 1.6 g Poly (ANTMA-co-MHPMA-co-MMA) of Example 4, 8.2 g PGMEA and 156.1 g methyl-2-hydroxy isobutyrate (HBM) were mixed to obtain a 3 wt % solution, based on total weight of the composition. The solution was filtered through a PTFE micro filter with 0.45 micron pore size to obtain Gap-fill Composition 3 [n/k at 248 nm=1.69/0.1].

Example 9

Gap-Fill Composition 4

0.54 g hexamethylol melamine, 0.0435 g (4-t-butylphenyl) tetramethylenesulfonium (3-hydroxyadamantanyl ester)-tetrafluoro-butanesulfonate) (T-2), 0.0027 g fluorochemical surfactant Polyfox 656 (OMNOVA solutions Inc.), 3.7 g Poly (hydroxymethylbenzene-co-MMA) of Example 3, 1.1 g Poly (ANTMA-co-HPMA-co-EMA) of Example 5, 8.2 g PGMEA and 156.1 g methyl-2-hydroxy isobutyrate (HBM) were mixed to obtain a 3 wt % solution, based on total weight of the composition. The solution was filtered through a PTFE micro filter with 0.45 micron pore size to obtain Gap-fill Composition 4 [n/k at 248 nm=1.65/0.1].

Example 10

Gap-Fill Composition 5 (Comparative)

0.4 g tetramethoxymethyl glycouril, 0.032 g of p-TSA ammonium salt (T-1), 3.568 g Poly(4-hydroxystyrene) (Nisso, Japan, Mw=5.3K, PDI=1.1), and 96.0 g HBM were mixed to obtain a 4 wt % solution, based on total weight of the composition. The solution was filtered through a PTFE micro filter with 0.45 micron pore size to obtain Gap-fill Composition 3 [n/k at 248 nm=1.85/0.0].

Gap-Fill Compositions

Example 11

Gap-fill compositions are prepared by combining the components in the amounts shown in Table 1. The solutions are filtered through a PTFE filter having a 0.45 micron pore size to provide gap-fill compositions.

TABLE 1

| Gap-fill Comp'n | Polymer | TAG | Crosslinker | Surfactant | Solvent |
|---|---|---|---|---|---|
| 6 | P1-1 (3.2 g) P2-3 (1.6 g) | T-1 (43.5 mg) | C-1(0.54 g) | F-1(2.7 mg) | PGMEA(164.3 g) |
| 7 | P1-1 (3.2 g) P2-5(1.6 g) | T-1(43.5 mg) | C-1(0.54 g) | F-1(2.7 mg) | PGMEA(164.3 g) |
| 8 | P1-2 (3.2 g) P2-3(1.6 g | T-2(43.5 mg) | C-1(0.54 g) | F-1(2.7 mg) | PGMEA(164.3 g) |
| 9 | P1-19 (3.2 g) P2-9(1.6 g | T-1(43.5 mg) | C-1(0.54 g) | F-1(2.7 mg) | PGMEA(8.2 g)/HBM(156.1 g) |
| 10 | P1-19(3.2 g) P2-6(1.6 g) | T-1(43.5 mg) | C-1(0.54 g) | F-1(2.7 mg) | PGMEA(8.2 g)/HBM(156.1 g) |
| 11 | P1-21 (3.2 g) P2-3(1.6 g) | T-2(43.5 mg) | C-1(0.54 g) | F-1(2.7 mg) | PGMEA(8.2 g)/HBM(156.1 g)) |
| 12 | P1-21 (3.2 g) P2-5(1.6 g) | T-1(43.5 mg) | C-2(0.54 g) | F-1(2.7 mg) | PGMEA(8.2 g)/HBM(156.1 g) |
| 13 | P1-19(3.7 g) P2-5(1.1 g) | T-1(43.5 mg) | C-1(0.54 g) | F-1(2.7 mg) | PGMEA(8.2 g)/HBM(156.1 g) |

TABLE 1-continued

| Gap-fill Comp'n | Polymer | TAG | Crosslinker | Surfactant | Solvent |
|---|---|---|---|---|---|
| 14 | P1-25 (3.7 g) P2-6(1.1 g) | T-1(43.5 mg) | C-1(0.54 g) | F-1(2.7 mg) | PGMEA(8.2 g)/HBM(156.1 g) |
| 15 | P1-21 (3.7 g) P2-5(1.1 g) | T-2(43.5 mg) | C-2(0.54 g) | F-1(2.7 mg) | PGMEA(8.2 g)/HBM(156.1 g) |

PGMEA = propylene glycol monomethyl ether acetate; HBM = methyl-2-hydroxy isobutyrate; T1 = p-toluenesulfonic acid ammonium salts; T2 = (4-tbutylphenyl)tetramethylenesulfonium (3-hydroxyadamantanyl ester)-tetrafluoro-butanesulfonate); C-1 = tetramethoxymethyl glycouril; C-2 = hexamethylol melamine; and F-1 = fluorochemical surfactant Polyfox 656 (OM-NOVA Solutions Inc.).

Gap-Fill Process

Example 12

Figure 3A:
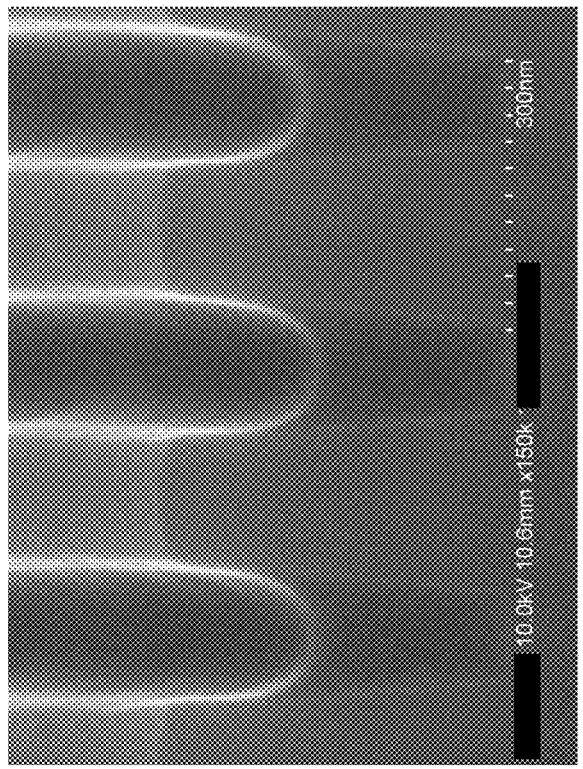
FIG. 3A-B shows SEM photomicrographs of post gap-fill trench patterns with gap-fill materials of the invention.
Figure 3B:
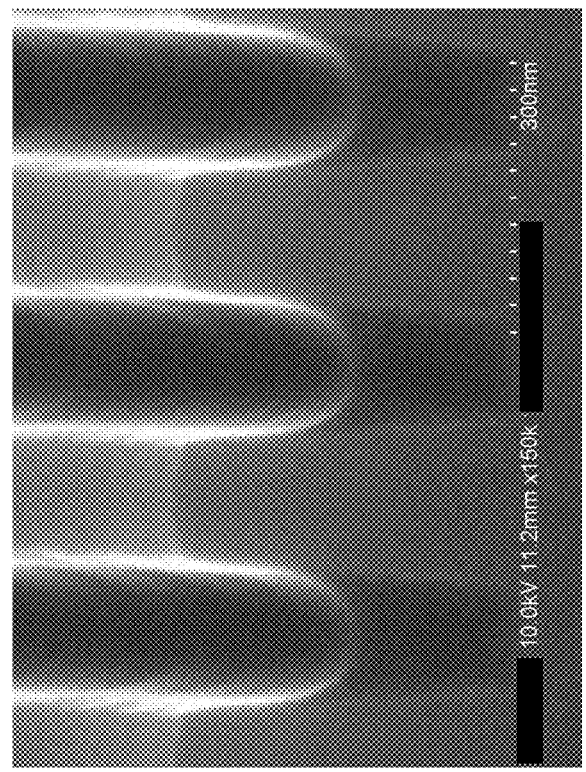
Figure 4A:
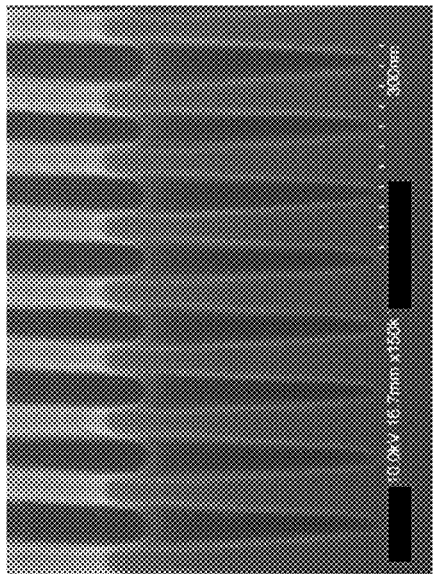
FIG. 4A-D shows SEM photomicrographs of post gap-fill trench patterns with gap-fill materials of the invention.
Figure 4B:
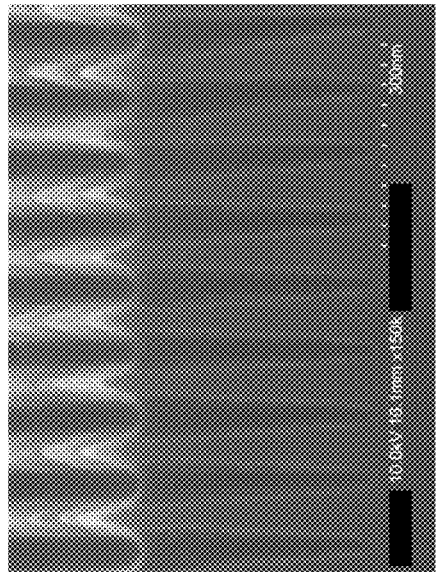
Figure 4C:
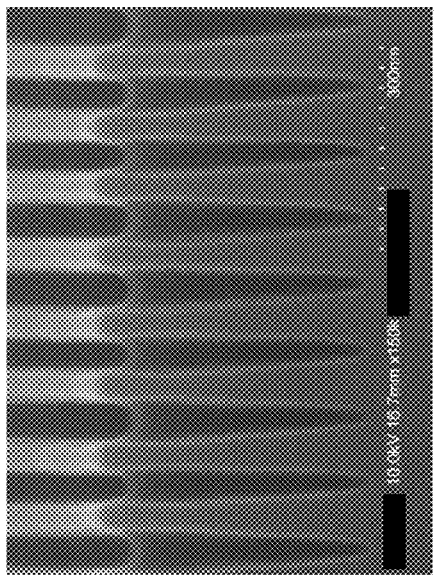
Figure 4D:
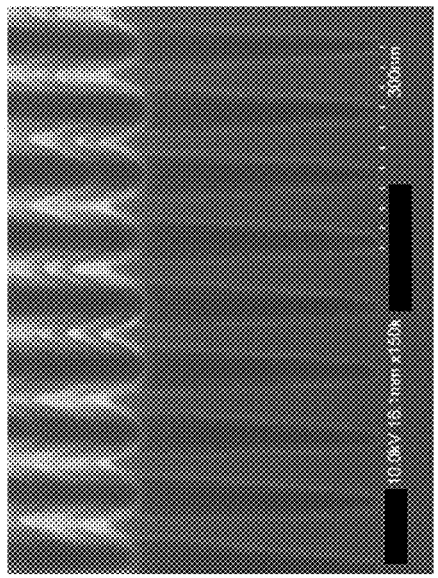

8-inch patterned 400 nm LPCVD $SiO_2$ on silicon wafers were provided. The patterns included trenches having a line and space of 300 nm and trenches having a line and space of 150 nm. The gap-fill compositions of Examples 6 and 7 were each spin-coated over the patterned surface of a respective wafer at 1500 rpm to give a film thickness of about 100 nm. The compositions were heated on a hotplate at 215° C. for one minute to cause the polymer to crosslink. The trench patterns after crosslinking are shown in the SEM photomicrographs of FIGS. 3A (150 nm 1:1 trench pattern with aspect ratio of 2.67, Gap-fill Composition 1) and 3B (150 nm 1:1 trench pattern with aspect ratio 2.67, Gap-fill Composition 2). Based on visual observation by SEM, the trenches were filled without the formation of voids.

Example 13

8-inch silicon wafers having a trench-patterned bilayer stack of 135 nm $SiO_2$ on 400 nm Si were provided. The trench spacing varied in width in a vertical direction, having a minimum of 20 nm spacing at the trench bottom, a maximum of 58 nm near the top of the trench and a mid-height width of ~45 nm. Each of Gap-fill Compositions 1-4 (Examples 6-9) were spin-coated over the patterned surface of a respective wafer at 1500 rpm to give a film thickness of about 200 nm. The compositions were heated on a hotplate at 215° C. for one minute to cause the polymer to crosslink. Scanning electron microscopy at 150 k magnification was conducted to examine the quality of the gap-fill process, with the resulting SEM photomicrographs for Gap-fill Compositions 1-4 being shown in FIG. 4A-D, respectively. Based on visual observation by SEM, the trenches were filled without the formation of voids.

Example 14

8-inch patterned 400 nm LPCVD $SiO_2$ on silicon wafers are provided. The patterns include trenches having a line and space of 45 nm and contact hole having a width (i.e., diameter) of 45 nm. The gap-fill compositions of Examples 4-13 are spin-coated over the patterned surface of respective wafers at 1500 rpm to give a film thickness of about 100 nm. The compositions are heated on a hotplate at 215° C. for one minute to cause the polymer to crosslink. It is expected that the trenches and holes are filled without the formation of voids.

Lithography Process

Example 15

Figure 5B:
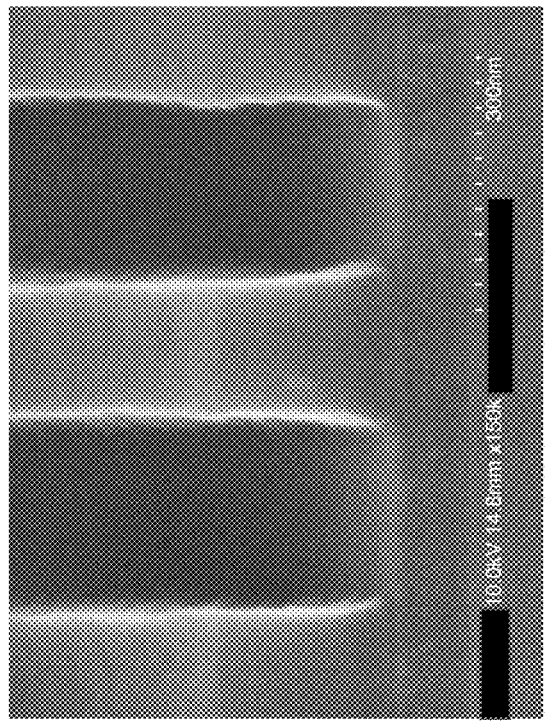
FIG. 5A-B shows SEM photomicrographs of photoresist patterns formed over a layer of a comparative gap-fill material and a layer of a gap-fill composition of the invention, respectively.
Figure 5A:
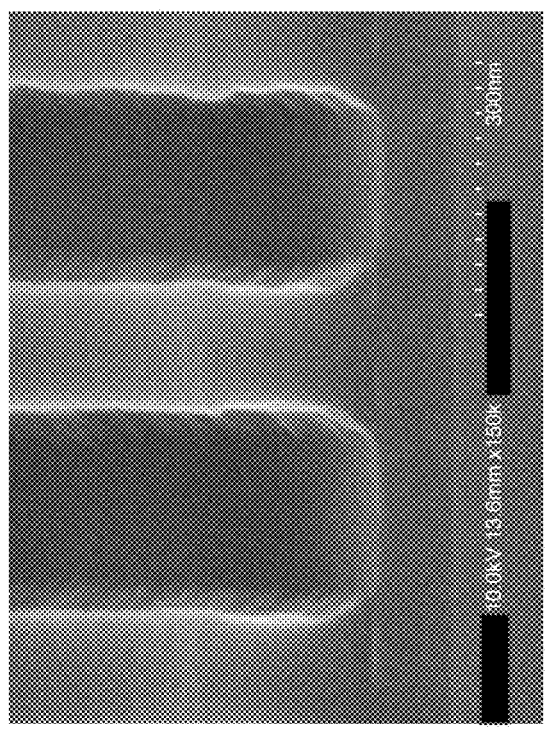

Gap-fill Compositions 2 and 5 were each spin-coated on 150-mm silicon wafers at 1500 rpm, and then baked at 215° C. for one minute using a TEL Mark 8 wafer coating track machine. The gap-fill coating thickness after bake was 1000 Å. Dow UV™1610 DUV photoresist was spin-coated on top of the gap-fill coating and baked at 100° C. for 60 seconds to give a 240 nm thick layer of photoresist. The photoresist was next exposed through a target mask using a 248 nm KrF wafer stepper with 0.65 NA. The photoresist layer was next post-exposure baked at 120° C. for 60 seconds, and then developed using Dow MF™ CD-26 TMAH developer in a standard 60 second single puddle process. Scanning electron microscopy at 150 k magnification was conducted to examine the quality of the photoresist pattern profiles, with the resulting SEM photomicrographs being shown in FIG. 4A-B. FIG. 5A, which used Gap-fill Composition 5 (Comp.) including a single polymer system without chromophore, showed a large degree of footing as compared with the filled trenches shown in FIG. 5B, which used Gap-fill Composition 2 including a polymer blend in accordance with the invention.

What is claimed is:

1. A gap-fill method, comprising:
   (a) providing a semiconductor substrate having a relief image on a surface of the substrate, the relief image comprising a plurality of gaps to be filled, wherein the gaps have a width of 50 nm or less;
   (b) applying a gap-fill composition over the relief image, wherein the gap-fill composition comprises a first polymer comprising a crosslinkable group, a second polymer comprising a chromophore, wherein the first polymer and the second polymer are different, a crosslinker, an acid catalyst, and a solvent, wherein the gap-fill composition is disposed in the gaps;
   (c) heating the gap-fill composition at a temperature to cause the first polymer to self-crosslink and/or to crosslink with the second polymer to form a crosslinked polymer;
   (d) forming a photoresist layer over the substrate comprising the crosslinked polymer-filled gaps;
   (e) patternwise exposing the photoresist layer to activating radiation; and
   (f) developing the photoresist layer to form a photoresist pattern.

2. The method of claim 1, wherein the first polymer and/or the second polymer has a weight average molecular weight Mw of from 3000 to 6000.

3. The method of claim 1, wherein the gaps have an aspect ratio of 2 or more.

4. The method of claim 1, wherein the gaps have a width of 15 nm or less.

5. The method of claim 1, wherein the crosslinkable group comprises a functional group independently chosen from hydroxyl, carboxyl, thiol, amine, epoxy, alkoxy, amide and vinyl.

6. The method of claim 1, wherein the chromophore is chosen from optionally substituted benzyl, phenyl, naphthyl and anthracenyl.

7. The method of claim 1, wherein the patternwise exposing is conducted at an exposure wavelength at 193 or 248.

8. The method of claim 1, wherein the first polymer comprises a unit of the following general formula (I):

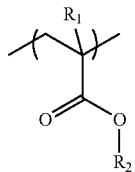

(I)

wherein: $R_1$ is chosen from hydrogen, fluorine, $C_1$-$C_3$ alkyl and $C_1$-$C_3$ fluoroalkyl; and $R_2$ is chosen from: optionally substituted $C_1$ to $C_{12}$ linear, branched or cyclic alkyl; and optionally substituted $C_6$ to $C_{15}$ aryl (e.g. phenyl, napthyl, anthracenyl), optionally containing heteroatoms; wherein at least one hydrogen atom on $R_1$ and/or on $R_2$ is substituted with a crosslinkable functional group.

9. The method of claim 1, wherein the first polymer comprises a unit of the following general formula (I):

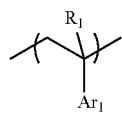

(II)

wherein $R_3$ is chosen from hydrogen, fluorine, $C_1$-$C_3$ alkyl and $C_1$-$C_3$ fluoroalkyl; and $Ar_1$ is an optionally substituted aryl group, wherein at least one hydrogen atom on $R_3$ and/or on $Ar_1$ is substituted with a crosslinkable functional group.

10. The method of claim 1, wherein the weight ratio of the first polymer to the second polymer is from 2:1 to 4:1.

* * * * *